(12) United States Patent
Tsai

(10) Patent No.: US 10,613,560 B2
(45) Date of Patent: Apr. 7, 2020

(54) BUFFER STAGE AND CONTROL CIRCUIT

(71) Applicant: MEDIATEK INC., Hsin-Chu (TW)

(72) Inventor: Chihhou Tsai, New Taipei (TW)

(73) Assignee: MediaTek Inc., Hsin-Chu (TW)

(*) Notice: Subject to any disclaimer, the term of this patent is extended or adjusted under 35 U.S.C. 154(b) by 0 days.

(21) Appl. No.: 15/647,469

(22) Filed: Jul. 12, 2017

(65) Prior Publication Data

US 2018/0041195 A1 Feb. 8, 2018

Related U.S. Application Data

(60) Provisional application No. 62/371,250, filed on Aug. 5, 2016.

(51) Int. Cl.
| | | |
|---|---|---|
| G05F 1/56 | (2006.01) | |
| H03F 1/30 | (2006.01) | |
| H03F 3/50 | (2006.01) | |
| G05F 3/24 | (2006.01) | |
| H03F 1/34 | (2006.01) | |
| H03F 1/56 | (2006.01) | |

(52) U.S. Cl.
CPC .............. *G05F 1/561* (2013.01); *G05F 3/247* (2013.01); *H03F 1/301* (2013.01); *H03F 1/34* (2013.01); *H03F 1/56* (2013.01); *H03F 3/505* (2013.01); *H03F 2200/18* (2013.01); *H03F 2200/21* (2013.01); *H03F 2200/288* (2013.01); *H03F 2200/555* (2013.01); *H03F 2200/69* (2013.01)

(58) Field of Classification Search
CPC ............. H03F 2200/69; H03F 2200/21; H03F 2200/18; H03F 2200/555; H03F 2200/288; H03F 1/56; H03F 1/34; H03F 1/505; H03F 1/301; G05F 1/56; G05F 3/247

See application file for complete search history.

(56) References Cited

U.S. PATENT DOCUMENTS

| | | | | |
|---|---|---|---|---|
| 3,984,780 A | | 10/1976 | Hsiao et al. | |
| 4,263,562 A | * | 4/1981 | Seiler .................. | H03F 1/56 330/257 |
| 4,761,615 A | * | 8/1988 | Maloberti ........... | H03F 1/3205 326/87 |
| 5,361,041 A | * | 11/1994 | Lish .................... | H03F 3/3001 330/255 |

(Continued)

FOREIGN PATENT DOCUMENTS

| | | |
|---|---|---|
| CN | 101051821 A | 10/2007 |
| CN | 103378850 A | 10/2013 |

(Continued)

*Primary Examiner* — Thomas J. Hiltunen
(74) *Attorney, Agent, or Firm* — Wolf, Greenfield & Sacks, P.C.

(57) ABSTRACT

A buffer stage includes a control circuit. The control circuit includes a voltage generator, a voltage-to-current converter, and a current-to-voltage converter. The voltage generator is configured to generate a compensation voltage. The voltage-to-current converter is configured to convert the compensation voltage into a compensation current. The current-to-voltage converter is configured to convert the compensation current into a recovery compensation voltage. The recovery compensation voltage is arranged for modifying an output voltage of the buffer stage.

22 Claims, 7 Drawing Sheets

(56) References Cited

U.S. PATENT DOCUMENTS

| | | | | |
|---|---|---|---|---|
| 5,391,979 | A * | 2/1995 | Kajimoto | G05F 3/30 |
| | | | | 323/313 |
| 5,446,405 | A * | 8/1995 | Ikeda | H03F 1/303 |
| | | | | 327/179 |
| 5,627,736 | A * | 5/1997 | Taylor | H02M 1/15 |
| | | | | 363/39 |
| 5,828,604 | A * | 10/1998 | Kawai | G11C 16/30 |
| | | | | 365/185.22 |
| 6,087,813 | A * | 7/2000 | Tobita | G05F 1/465 |
| | | | | 323/280 |
| 6,300,837 | B1 * | 10/2001 | Sowlati | H03F 1/0261 |
| | | | | 330/267 |
| 6,844,782 | B2 | 1/2005 | Otaka | H03G 1/04 |
| | | | | 330/254 |
| 6,956,437 | B2 * | 10/2005 | Lopez | G05F 3/205 |
| | | | | 330/289 |
| 7,944,303 | B2 | 5/2011 | Cozzolino | |
| 8,183,926 | B2 * | 5/2012 | Degoirat | H03H 11/245 |
| | | | | 323/315 |
| 8,217,718 | B2 * | 7/2012 | Horbach | H03K 7/08 |
| | | | | 330/207 A |
| 8,310,277 | B2 * | 11/2012 | Su | G01R 19/04 |
| | | | | 327/58 |
| 8,542,065 | B2 * | 9/2013 | Sawa | H03F 3/08 |
| | | | | 330/288 |
| 8,669,808 | B2 * | 3/2014 | Liu | H03L 7/0995 |
| | | | | 327/156 |
| 8,890,603 | B2 * | 11/2014 | Mitsuda | H03K 17/687 |
| | | | | 327/108 |
| 9,041,466 | B2 * | 5/2015 | Ortiz | H03F 3/45076 |
| | | | | 330/165 |
| 9,413,296 | B2 * | 8/2016 | Lu | H03F 1/0205 |
| 9,417,641 | B2 * | 8/2016 | Signoff | G05F 1/46 |
| 9,459,639 | B2 * | 10/2016 | Kasai | G05F 1/56 |
| 9,742,368 | B2 * | 8/2017 | Wang | H03F 3/265 |
| 10,218,326 | B2 * | 2/2019 | Chen | H03F 1/223 |
| 2006/0022743 | A1 | 2/2006 | Chou | |
| 2007/0090860 | A1 | 4/2007 | Hsu | |
| 2008/0042735 | A1 | 2/2008 | Ide | |
| 2009/0195302 | A1 | 8/2009 | Lin et al. | |
| 2009/0212863 | A1 * | 8/2009 | Ishimaru | H03F 1/302 |
| | | | | 330/253 |
| 2010/0001890 | A1 | 1/2010 | Barbieri et al. | |
| 2011/0163795 | A1 | 7/2011 | Ito | |
| 2013/0058506 | A1 * | 3/2013 | Boor | H03F 3/185 |
| | | | | 381/122 |

FOREIGN PATENT DOCUMENTS

| | | |
|---|---|---|
| CN | 203406848 U | 1/2014 |
| EP | 0 913 932 A2 | 5/1999 |
| EP | 1 388 926 A1 | 2/2004 |
| TW | 432842 B | 5/2001 |
| TW | 200926127 A | 6/2009 |
| TW | M420118 U | 1/2012 |
| TW | 201339792 A | 10/2013 |

* cited by examiner

BUFFER STAGE AND CONTROL CIRCUIT

CROSS REFERENCE TO RELATED APPLICATIONS

This application claims the benefit of U.S. Provisional Application No. 62/371,250, filed on Aug. 5, 2016, the entirety of which is incorporated by reference herein.

BACKGROUND OF THE INVENTION

Field of the Invention

The disclosure generally relates to a buffer stage, and more specifically, to a buffer stage and a control circuit therein.

Description of the Related Art

In the electronics field, a common-drain amplifier, also known as a source follower, is one of the basic single-stage field effect transistor amplifier topologies, and is typically used as a voltage buffer. In this circuit, the gate terminal of the transistor serves as the input, the source is the output, and the drain is common to both (input and output). A source follower is used to transform impedances. For example, the Thévenin resistance of a combination of a source follower driven by a voltage source with high Thévenin resistance is reduced to only the output resistance of the source follower (i.e. a very low resistance). That resistance reduction makes the combination a more ideal voltage source.

However, the output voltage level of the source follower cannot be the same as the input voltage level of the source follower because a driving voltage difference exists between the gate terminal and the source of the source follower. This is a non-ideal characteristic of the source follower. Accordingly, there is a need to design a novel solution for overcoming the problem of the prior art.

BRIEF SUMMARY OF THE INVENTION

In a preferred embodiment, the disclosure is directed to a buffer stage including a control circuit. The control circuit includes a voltage generator, a voltage-to-current converter, and a current-to-voltage converter. The voltage generator is configured to generate a compensation voltage. The voltage-to-current converter is configured to convert the compensation voltage into a compensation current. The current-to-voltage converter is configured to convert the compensation current into a recovery compensation voltage. The recovery compensation voltage is arranged for modifying an output voltage of the buffer stage.

In some embodiments, the buffer stage further includes a source follower. The source follower is coupled to the control circuit, and is configured to generate the output voltage of the buffer stage.

In some embodiments, the current-to-voltage converter is a first resistor coupled between an input node of the buffer stage and the source follower.

In some embodiments, the source follower includes a first N-type transistor and a first current sink. The first N-type transistor has a control terminal coupled to a first node, a first terminal coupled to an output node of the buffer stage, and a second terminal coupled to a supply voltage. The first current sink draws a first sink current from the output node of the buffer stage. The first resistor is coupled between the input node of the buffer stage and the first node.

In some embodiments, the voltage generator includes a first current source and a second N-type transistor. The first current source supplies a first source current to a second node. The second N-type transistor has a control terminal coupled to the second node, a first terminal coupled to a ground voltage, and a second terminal coupled to the second node.

In some embodiments, the voltage-to-current converter includes an operational amplifier, a first P-type transistor, a second resistor, and a second P-type transistor. The operational amplifier has a positive input terminal coupled to a third node, a negative input terminal coupled to the second node, and an output terminal coupled to a fourth node. The first P-type transistor has a control terminal coupled to the fourth node, a first terminal coupled to the supply voltage, and a second terminal coupled to the third node. The second resistor is coupled between the third node and the ground voltage. The second P-type transistor has a control terminal coupled to the fourth node, a first terminal coupled to the supply voltage, and a second terminal coupled to the first node.

In some embodiments, the resistance of the second resistor is substantially equal to the resistance of the first resistor.

In some embodiments, the voltage-to-current converter further includes a capacitor. The capacitor is coupled between the fourth node and the third node.

In some embodiments, the voltage generator includes a first current source and a second N-type transistor. The first current source supplies a first source current to a second node. The second N-type transistor has a control terminal coupled to a third node, a first terminal coupled to a ground voltage, and a second terminal coupled to the second node.

In some embodiments, the voltage-to-current converter includes a third N-type transistor, a second resistor, a first P-type transistor, and a second P-type transistor. The third N-type transistor has a control terminal coupled to the second node, a first terminal coupled to the third node, and a second terminal coupled to a fourth node. The second resistor is coupled between the third node and the ground voltage. The first P-type transistor has a control terminal coupled to the fourth node, a first terminal coupled to the supply voltage, and a second terminal coupled to the fourth node. The second P-type transistor has a control terminal coupled to the fourth node, a first terminal coupled to the supply voltage, and a second terminal coupled to the first node.

In some embodiments, the resistance of the second resistor is substantially equal to the resistance of the first resistor.

In some embodiments, the source follower includes a first P-type transistor and a first current source. The first P-type transistor has a control terminal coupled to a first node, a first terminal coupled to an output node of the buffer stage, and a second terminal coupled to a ground voltage. The first current source supplies a first source current to the output node of the buffer stage. The first resistor is coupled between the input node of the buffer stage and the first node.

In some embodiments, the voltage generator includes a first current sink and a second P-type transistor. The first current sink draws a first sink current from a second node. The second P-type transistor has a control terminal coupled to a third node, a first terminal coupled to a supply voltage, and a second terminal coupled to the second node.

In some embodiments, the voltage-to-current converter includes a third P-type transistor, a second resistor, a first N-type transistor, and a second N-type transistor. The third P-type transistor has a control terminal coupled to the second node, a first terminal coupled to the third node, and a second terminal coupled to a fourth node. The second resistor is coupled between the supply voltage and the third node. The first N-type transistor has a control terminal coupled to the fourth node, a first terminal coupled to the ground voltage, and a second terminal coupled to the fourth node. The second N-type transistor has a control terminal coupled to the fourth node, a first terminal coupled to the ground voltage, and a second terminal coupled to the first node.

In some embodiments, the resistance of the second resistor is substantially equal to the resistance of the first resistor.

In some embodiments, the source follower includes a first P-type transistor, a first current source, a first N-type transistor, and a first current sink. The first P-type transistor has a control terminal coupled to a first node, a first terminal coupled to a second node, and a second terminal coupled to a ground voltage. The first current source supplies a first source current to the second node. The first N-type transistor has a control terminal coupled to the second node, a first terminal coupled to an output node of the buffer stage, and a second terminal coupled to a supply voltage. The first current sink draws a first sink current from the output node of the buffer stage. The first resistor is coupled between the input node of the buffer stage and the first node.

In some embodiments, the voltage generator includes a second current sink, a second P-type transistor, a second current source, and a second N-type transistor. The second current sink draws a second sink current from a third node. The second P-type transistor has a control terminal coupled to a fourth node, a first terminal coupled to the supply voltage, and a second terminal coupled to the third node. The second current source supplies a second source current to a fifth node. The second N-type transistor has a control terminal coupled to a sixth node, a first terminal coupled to the ground voltage, and a second terminal coupled to the fifth node.

In some embodiments, the voltage-to-current converter includes a third P-type transistor, a second resistor, a third N-type transistor, a third resistor, a fourth P-type transistor, and a fifth P-type transistor. The third P-type transistor has a control terminal coupled to the third node, a first terminal coupled to the fourth node, and a second terminal coupled to a seventh node. The second resistor is coupled between the supply voltage and the fourth node. The third N-type transistor has a control terminal coupled to the fifth node, a first terminal coupled to the sixth node, and a second terminal coupled to the seventh node. The third resistor is coupled between the sixth node and the ground voltage. The fourth P-type transistor has a control terminal coupled to the seventh node, a first terminal coupled to the supply voltage, and a second terminal coupled to the seventh node. The fifth P-type transistor has a control terminal coupled to the seventh node, a first terminal coupled to the supply voltage, and a second terminal coupled to the first node.

In some embodiments, the resistance of each of the second resistor and the third resistor is substantially equal to the resistance of the first resistor.

In some embodiments, the voltage-to-current converter further includes a third current sink. The third current sink draws a third sink current from the seventh node.

In some embodiments, the voltage-to-current converter further includes a fourth current sink. The fourth current sink draws a fourth sink current from the first node.

In some embodiments, the fourth sink current is substantially equal to the third sink current.

In another preferred embodiment, the invention is directed to a control circuit for controlling a source follower. The control circuit includes a voltage generator, a voltage-to-current converter, and a current-to-voltage converter. The voltage generator is configured to generate a compensation voltage. The voltage-to-current converter is configured to convert the compensation voltage into a compensation current. The current-to-voltage converter is configured to convert the compensation current into a recovery compensation voltage. The recovery compensation voltage is arranged for modifying an output voltage from the source follower.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
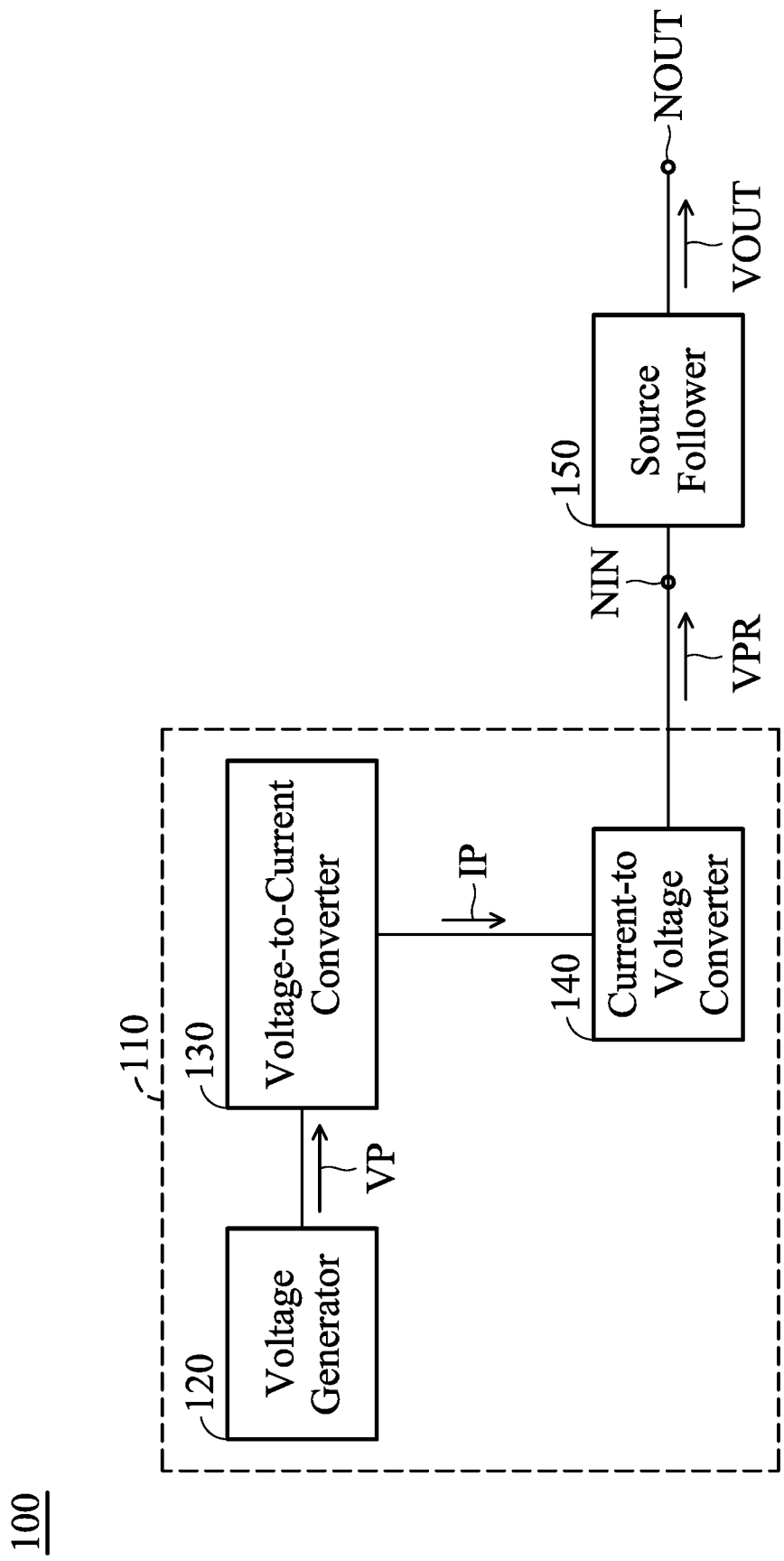
FIG. 1 is a diagram of a buffer stage according to an embodiment of the invention.

FIG. 1 is a diagram of a buffer stage 100 according to an embodiment of the invention. The buffer stage 100 may be used as an output stage with a low output resistance. As shown in FIG. 1, the buffer stage 100 at least includes a control circuit 110. The control circuit 110 includes a voltage generator 120, a voltage-to-current (V-to-I) converter 130, and a current-to-voltage (I-to-V) converter 140. The voltage generator 120 is configured to generate a compensation voltage VP. The voltage-to-current converter 130 is configured to convert the compensation voltage VP into a compensation current IP. The compensation current IP may be linearly related to the compensation voltage VP. For example, the magnitude of the compensation current IP may be proportional to the magnitude of the compensation voltage VP, but it is not limited thereto. The current-to-voltage converter 140 is configured to convert the compensation current IP into a recovery compensation voltage VPR. The recovery compensation voltage VPR may be linearly related to the compensation current IP. For example, the magnitude of the recovery compensation voltage VPR may be proportional to the magnitude of the compensation current IP, but it is not limited thereto. The recovery compensation voltage VPR is arranged for modifying an output voltage VOUT of the buffer stage 100. The control circuit 110 can be used independently, or be designed together with a source follower. In some embodiments, the buffer stage 100 further includes a source follower 150. The source follower 150 is coupled to the control circuit 110, and is configured to generate the output voltage VOUT of the buffer stage 100. Generally, the control circuit 110 is capable of providing the recovery compensation voltage VPR, so as to compensate for the non-ideal voltage difference between an output node NOUT and an input node NIN of the buffer stage 100 (or of the source follower 150).

The detailed circuit structure of the proposed buffer stage and control circuit therein will be described in the following embodiments. It should be understood that these embodiments and figures are just exemplary, rather than limitations of the invention.

Figure 2:
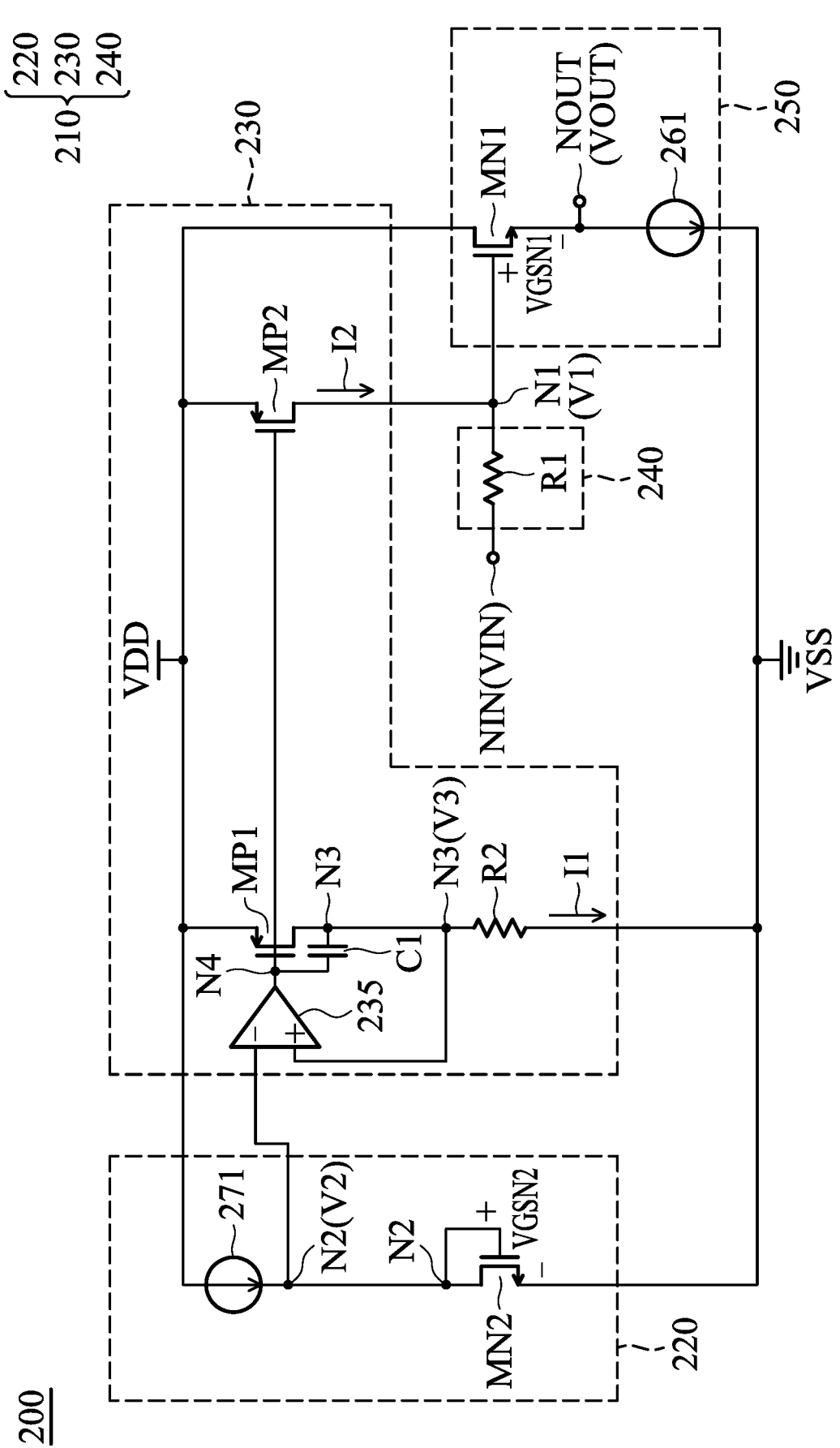
FIG. 2 is a diagram of a buffer stage according to an embodiment of the invention.

FIG. 2 is a diagram of a buffer stage 200 according to an embodiment of the invention. In the embodiment of FIG. 2, the buffer stage 200 includes a control circuit 210 and a source follower 250. The source follower 250 includes a first N-type transistor MN1 and a first current sink 261. The first N-type transistor MN1 may be a first NMOS transistor (N-type Metal-Oxide-Semiconductor Field-Effect Transistor). The first N-type transistor MN1 has a control terminal coupled to a first node N1, a first terminal coupled to an output node NOUT of the buffer stage 200, and a second terminal coupled to a supply voltage VDD. The first current sink 261 draws a first sink current from the output node NOUT of the buffer stage 200. A voltage generator 220 of the control circuit 210 includes a first current source 271 and a second N-type transistor MN2. The second N-type transistor MN2 may be a second NMOS transistor. The first current source 271 supplies a first source current to a second node N2. The second N-type transistor MN2 has a control terminal coupled to the second node N2, a first terminal coupled to a ground voltage VSS, and a second terminal coupled to the second node N2. A voltage-to-current converter 230 of the control circuit 210 includes an operational amplifier (OP) 235, a second resistor R2, a first P-type transistor MP1, and a second P-type transistor MP2. The type of the operational amplifier 235 is not limited in the invention. For example, the operational amplifier 235 may be a differential amplifier with an active current mirror load. The first P-type transistor MP1 may be a first PMOS transistor (P-type Metal-Oxide-Semiconductor Field-Effect Transistor). The second P-type transistor MP2 may be a second PMOS transistor. The operational amplifier 235 has a positive input terminal coupled to a third node N3, a negative input terminal coupled to the second node N2, and an output terminal coupled to a fourth node N4. The second resistor R2 is coupled between the third node N3 and the ground voltage VSS. The resistance of the second resistor R2 may be substantially equal to the resistance of the first resistor R1. The first P-type transistor MP1 has a control terminal coupled to the fourth node N4, a first terminal coupled to the supply voltage VDD, and a second terminal coupled to the third node N3. The second P-type transistor MP2 has a control terminal coupled to the fourth node N4, a first terminal coupled to the supply voltage VDD, and a second terminal coupled to the first node N1. A current mirror is formed by the first P-type transistor MP1 and the second P-type transistor MP2. The first P-type transistor MP1 and the second P-type transistor MP2 substantially have the same transistor size. In some embodiments, the voltage-to-current converter 230 further includes a capacitor C1 coupled between the fourth node N4 and the third node N3, so as to fine-tune the frequency response of the operational amplifier 235. A current-to-voltage converter 240 of the control circuit 210 includes a first resistor R1 coupled between an input node NIN of the buffer stage 200 and the first node N1.

The operation theory of the buffer stage 200 can be understood according to the following equations (1) to (9).

$$V1 - VOUT = VGSN1 \quad (1)$$

$$V2 - VSS = VGSN2 \quad (2)$$

$$V3 = V2 \quad (3)$$

$$R2 = \frac{R1}{A} \quad (4)$$

$$I1 = \frac{V3 - VSS}{R2} = \frac{VGSN2}{R2} \quad (5)$$

$$I2 = \frac{I1}{A} \quad (6)$$

$$VGSN = I1 \cdot R2 = (A \cdot I2) \times \left(\frac{R1}{A}\right) = I2 \cdot R1 \quad (7)$$

$$V1 = VIN + I2 \times R1 = VIN + VGSN2 \quad (8)$$

$$VOUT = V1 - VGSN1 = VIN + VGSN2 - VGSN1 \approx VIN \quad (9)$$

where "V1" represents the voltage V1 at the first node N1, "VOUT" represents the output voltage VOUT at the output node NOUT of the buffer stage 200, "VGSN1" represents the voltage difference between the control terminal and the first terminal of the first N-type transistor MN1, "VGSN2" represents the voltage difference between the control terminal and the first terminal of the second N-type transistor MN2, "A" represents a constant value, "V2" represents the voltage V2 at the second node N2, "VSS" represents the ground voltage VSS, "V3" represents the voltage V3 at the third node N3, "R1" represents the resistance of the first resistor R1, "R2" represents the resistance of the second resistor R2, "I1" represents the current flowing through the second resistor R2, "I2" represents the current flowing through the first resistor R1, and "VIN" represents the input voltage VIN at the input node NIN of the buffer stage 200.

That is, the voltage generator 220 may provide the voltage V2 at the second node N2. By appropriately designing the transistor size of the second N-type transistor MN2 and the first source current from the first current source 271, the voltage difference VGSN2 between the voltage V2 and the ground voltage VSS can be substantially equal to the voltage difference VGSN1 between the control terminal and the first terminal of the first N-type transistor MN1. The voltage V2 can be considered as the aforementioned compensation voltage VP. The voltage V3 at the third node N3 may be equal to the voltage V2 at the second node N2 because of the virtual short of the operational amplifier 235. The current I1 flowing through the second resistor R2 may be linearly related to the voltage V3. The first P-type transistor MP1 and the second P-type MP2 can form a current mirror, so that the current I2 flowing through the first resistor R1 may be substantially 1/A times the current I1 flowing through the second resistor R2, where "A" may be any constant positive value. The current I2 may can be considered as the aforementioned compensation current IP. According to Ohm's Law, if the resistance of the first resistor R1 is A times the resistance of the second resistor R2, the voltage V1 at the first node N1 may be higher than the input voltage VIN at the input node NIN by the voltage difference VGSN2. The voltage V1 can be considered as the aforementioned recovery compensation voltage VPR. With such a design, the output voltage VOUT at the output node NOUT may be lower than the voltage V1 by the voltage difference VGSN1. If the voltage difference VGSN2 is substantially equal to the voltage difference VGSN1, the output voltage VOUT can be substantially equal to the input voltage VIN.

Figure 3:
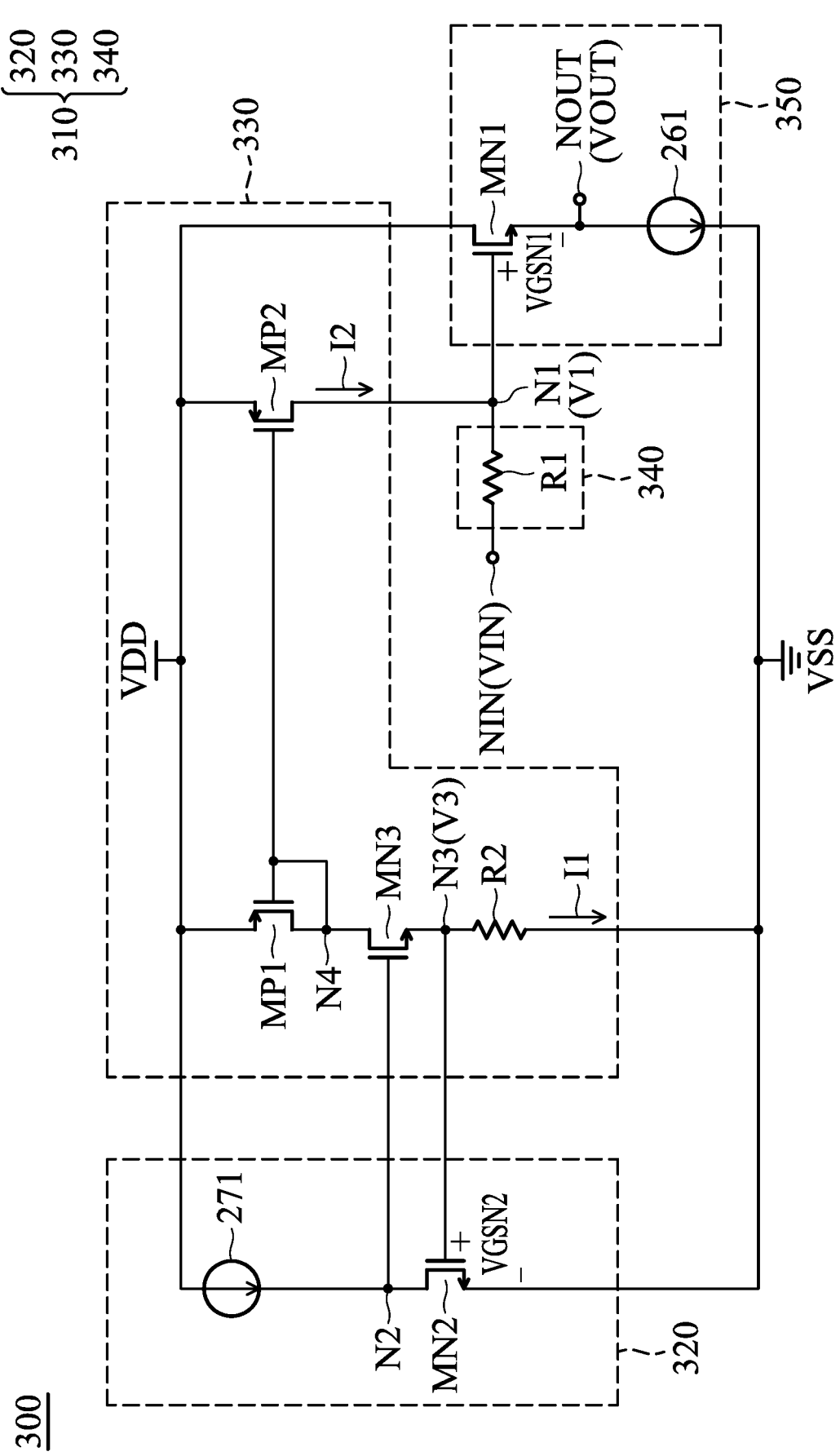
FIG. 3 is a diagram of a buffer stage according to an embodiment of the invention.

FIG. 3 is a diagram of a buffer stage 300 according to an embodiment of the invention. In the embodiment of FIG. 3, the buffer stage 300 includes a control circuit 310 and a source follower 350. The source follower 350 includes a first N-type transistor MN1 and a first current sink 261. The first N-type transistor MN1 may be a first NMOS transistor (N-type Metal-Oxide-Semiconductor Field-Effect Transistor). The first N-type transistor MN1 has a control terminal coupled to a first node N1, a first terminal coupled to an output node NOUT of the buffer stage 300, and a second terminal coupled to a supply voltage VDD. The first current sink 261 draws a first sink current from the output node NOUT of the buffer stage 300. A voltage generator 320 of the control circuit 310 includes a first current source 271 and a second N-type transistor MN2. The second N-type transistor MN2 may be a second NMOS transistor. The first current source 271 supplies a first source current to a second node N2. The second N-type transistor MN2 has a control terminal coupled to a third node N3, a first terminal coupled to a ground voltage VSS, and a second terminal coupled to the second node N2. A voltage-to-current converter 330 of the control circuit 310 includes a third N-type transistor MN3, a second resistor R2, a first P-type transistor MP1, and a second P-type transistor MP2. The third N-type transistor MN3 may be a third NMOS transistor. The first P-type transistor MP1 may be a first PMOS transistor (P-type Metal-Oxide-Semiconductor Field-Effect Transistor). The second P-type transistor MP2 may be a second PMOS transistor. The third N-type transistor MN3 has a control terminal coupled to the second node N2, a first terminal coupled to the third node N3, and a second terminal coupled to a fourth node N4. The second resistor R2 is coupled between the third node N3 and the ground voltage VSS. The resistance of the second resistor R2 may be substantially equal to the resistance of the first resistor R1. The first P-type transistor MP1 has a control terminal coupled to the fourth node N4, a first terminal coupled to the supply voltage VDD, and a second terminal coupled to the fourth node N4. The second P-type transistor MP2 has a control terminal coupled to the fourth node N4, a first terminal coupled to the supply voltage VDD, and a second terminal coupled to the first node N1. A current mirror is formed by the first P-type transistor MP1 and the second P-type transistor MP2. The first P-type transistor MP1 and the second P-type transistor MP2 substantially have the same transistor size. A current-to-voltage converter 340 of the control circuit 310 includes a first resistor R1 coupled between an input node NIN of the buffer stage 300 and the first node N1.

The operation theory of the buffer stage 300 can be understood according to the following equations (10) to (17).

$$V1 - VOUT = VGSN1 \quad (10)$$

$$V3 - VSS = VGSN2 \quad (11)$$

$$R2 = \frac{R1}{A} \quad (12)$$

$$I1 = \frac{V3 - VSS}{R2} = \frac{VGSN2}{R2} \quad (13)$$

$$I2 = \frac{I1}{A} \quad (14)$$

$$VGSN2 = I1 \cdot R2 = (A \cdot I2) \times \left(\frac{R1}{A}\right) = I2 \cdot R1 \quad (15)$$

$$V1 = VIN + I2 \times R1 = VIN + VGSN2 \quad (16)$$

$$VOUT = V1 - VGSN1 = VIN + VGSN2 - VGSN1 \approx VIN \quad (17)$$

where "V1" represents the voltage V1 at the first node N1, "VOUT" represents the output voltage VOUT at the output node NOUT of the buffer stage 300, "VGSN1" represents the voltage difference between the control terminal and the first terminal of the first N-type transistor MN1, "VGSN2" represents the voltage difference between the control terminal and the first terminal of the second N-type transistor MN2, "A" represents a constant value, "V3" represents the voltage V3 at the third node N3, "VSS" represents the ground voltage VSS, "R1" represents the resistance of the first resistor R1, "R2" represents the resistance of the second resistor R2, "I1" represents the current flowing through the second resistor R2, "I2" represents the current flowing through the first resistor R1, and "VIN" represents the input voltage VIN at the input node NIN of the buffer stage 300.

That is, the voltage generator 320 may provide the voltage V3 at the third node N3. By appropriately designing the transistor size of the second N-type transistor MN2 and the first source current from the first current source 271, the voltage difference VGSN2 between the voltage V3 and the ground voltage VSS can be substantially equal to the voltage difference VGSN1 between the control terminal and the first terminal of the first N-type transistor MN1. The voltage V3 can be considered as the aforementioned compensation voltage VP. The current I1 flowing through the second resistor R2 may be linearly related to the voltage V3. The first P-type transistor MP1 and the second P-type MP2 can form a current mirror, so that the current I2 flowing through the first resistor R1 may be substantially 1/A times the current I1 flowing through the second resistor R2, where "A" may be any constant positive value. The current I2 may can be considered as the aforementioned compensation current IP. According to Ohm's Law, if the resistance of the first resistor R1 is A times the resistance of the second resistor R2, the voltage V1 at the first node N1 may be higher than the input voltage VIN at the input node NIN by the voltage difference VGSN2. The voltage V1 can be considered as the aforementioned recovery compensation voltage VPR. With such a design, the output voltage VOUT at the output node NOUT may be lower than the voltage V1 by the voltage difference VGSN1. If the voltage difference VGSN2 is substantially equal to the voltage difference VGSN1, the output voltage VOUT can be substantially equal to the input voltage VIN.

Figure 4:
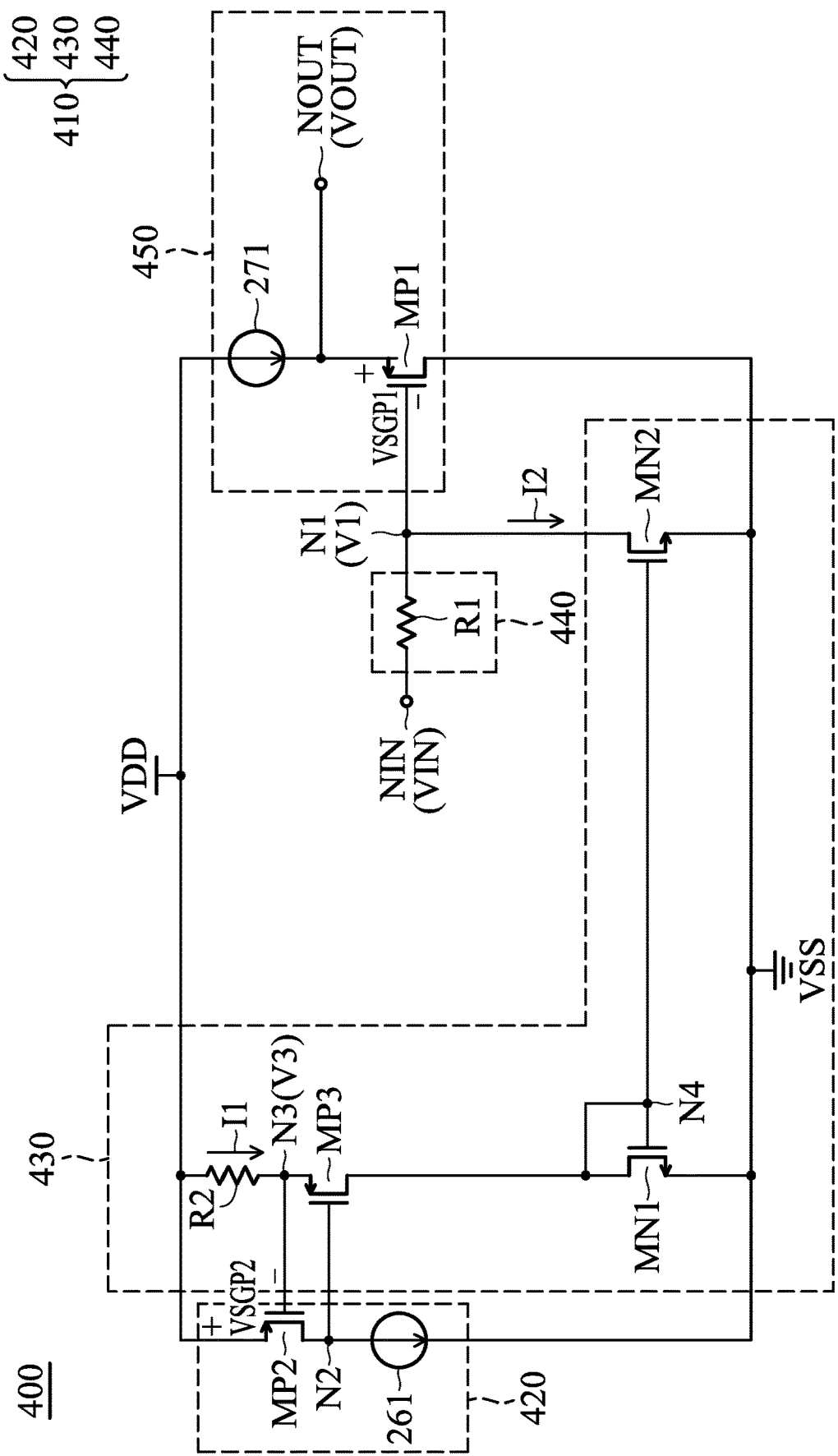
FIG. 4 is a diagram of a buffer stage according to an embodiment of the invention.

FIG. 4 is a diagram of a buffer stage 400 according to an embodiment of the invention. In the embodiment of FIG. 4, the buffer stage 400 includes a control circuit 410 and a source follower 450. The source follower 450 includes a first P-type transistor MP1 and a first current source 271. The first P-type transistor MP1 may be a first PMOS transistor (P-type Metal-Oxide-Semiconductor Field-Effect Transistor). The first P-type transistor MP1 has a control terminal coupled to a first node N1, a first terminal coupled to an output node NOUT of the buffer stage 400, and a second terminal coupled to a ground voltage VSS. The first current source 271 supplies a first source current to the output node NOUT of the buffer stage 400. A voltage generator 420 of the control circuit 410 includes a first current sink 261 and a second P-type transistor MP2. The second P-type transistor MP2 may be a second PMOS transistor. The first current sink 261 draws a first sink current from a second node N2. The second P-type transistor MP2 has a control terminal coupled to a third node N3, a first terminal coupled to a supply voltage VDD, and a second terminal coupled to the second node N2. A voltage-to-current converter 430 of the control circuit 410 includes a third P-type transistor MP3, a second resistor R2, a first N-type transistor MN1, and a second N-type transistor MN2. The third P-type transistor MP3 may be a third PMOS transistor. The first N-type transistor MN1 may be a first NMOS transistor (N-type Metal-Oxide-Semiconductor Field-Effect Transistor). The second N-type transistor MN2 may be a second NMOS transistor. The third P-type transistor MP3 has a control terminal coupled to the second node N2, a first terminal coupled to the third node N3, and a second terminal coupled to a fourth node N4. The second resistor R2 is coupled between the supply voltage VDD and the third node N3. The resistance of the second resistor R2 may be substantially equal to the resistance of the first resistor R1. The first N-type transistor MN1 has a control terminal coupled to the fourth node N4, a first terminal coupled to the ground voltage VSS, and a second terminal coupled to the fourth node N4. The second N-type transistor MN2 has a control terminal coupled to the fourth node N4, a first terminal coupled to the ground voltage VSS, and a second terminal coupled to the first node N1. A current mirror is formed by the first N-type transistor MN1 and the second N-type transistor MN2. The first N-type transistor MN1 and the second N-type transistor MN2 substantially have the same transistor size. A current-to-voltage converter 440 of the control circuit 410 includes a first resistor R1 coupled between an input node NIN of the buffer stage 400 and the first node N1.

The operation theory of the buffer stage 400 can be understood according to the following equations (18) to (25).

$$VOUT - V1 = VSGP1 \quad (18)$$

$$VDD - V3 = VSGP2 \quad (19)$$

$$R2 = \frac{R1}{A} \quad (20)$$

$$I1 = \frac{VDD - V3}{R2} = \frac{VSGP2}{R2} \quad (21)$$

$$I2 = \frac{I1}{A} \quad (22)$$

$$VSGP2 = I1 \cdot R2 = (A \cdot I2) \times \left(\frac{R1}{A}\right) = I2 \cdot R1 \quad (23)$$

$$V1 = VIN - I2 \times R1 = VIN - VSGP2 \quad (24)$$

$$VOUT = V1 + VSGP1 = VIN - VSGP2 + VSGP1 \approx VIN \quad (25)$$

where "V1" represents the voltage V1 at the first node N1, "VOUT" represents the output voltage VOUT at the output node NOUT of the buffer stage 400, "VSGP1" represents the voltage difference between the first terminal and the control terminal of the first P-type transistor MP1, "VSGP2" represents the voltage difference between the first terminal and the control terminal of the second P-type transistor MP2, "A" represents a constant value, "V3" represents the voltage V3 at the third node N3, "VDD" represents the supply voltage VDD, "R1" represents the resistance of the first resistor R1, "R2" represents the resistance of the second resistor R2, "I1" represents the current flowing through the second resistor R2, "I2" represents the current flowing through the first resistor R1, and "VIN" represents the input voltage VIN at the input node NIN of the buffer stage 400.

That is, the voltage generator 420 may provide the voltage V3 at the third node N3. By appropriately designing the transistor size of the second P-type transistor MP2 and the first sink current to the first current sink 261, the voltage difference VSGP2 between the supply voltage VDD and the voltage V3 can be substantially equal to the voltage difference VSGP1 between the first terminal and the control terminal of the first P-type transistor MP1. The voltage V3 can be considered as the aforementioned compensation voltage VP. The current I1 flowing through the second resistor R2 may be linearly related to the voltage V3. The first N-type transistor MN1 and the second N-type MN2 can form a current mirror, so that the current I2 flowing through the first resistor R1 may be substantially 1/A times the current I1 flowing through the second resistor R2, where "A" may be any constant positive value. The current I2 may can be considered as the aforementioned compensation current IP. According to Ohm's Law, if the resistance of the first resistor R1 is A times the resistance of the second resistor R2, the voltage V1 at the first node N1 may be lower than the input voltage VIN at the input node NIN by the voltage difference VSGP2. The voltage V1 can be considered as the aforementioned recovery compensation voltage VPR. With such a design, the output voltage VOUT at the output node NOUT may be higher than the voltage V1 by the voltage difference VSGP1. If the voltage difference VSGP2 is substantially equal to the voltage difference VSGP1, the output voltage VOUT can be substantially equal to the input voltage VIN.

Figure 5:
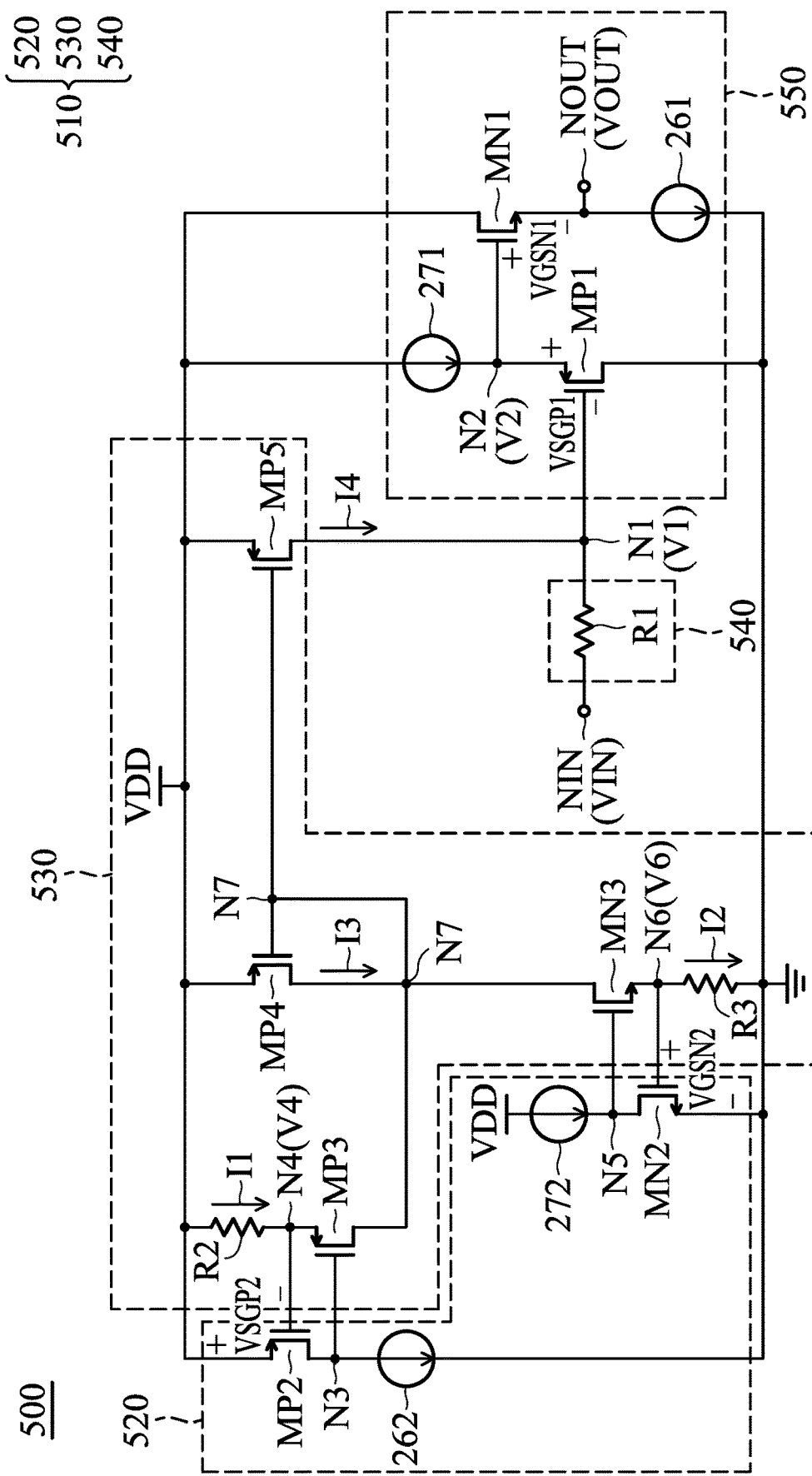
FIG. 5 is a diagram of a buffer stage according to an embodiment of the invention.

FIG. 5 is a diagram of a buffer stage 500 according to an embodiment of the invention. In the embodiment of FIG. 5, the buffer stage 500 includes a control circuit 510 and a source follower 550. The source follower 550 includes a first P-type transistor MP1, a first current source 271, a first N-type transistor MN1, and a first current sink 261. The first P-type transistor MP1 may be a first PMOS transistor (P-type Metal-Oxide-Semiconductor Field-Effect Transistor). The first N-type transistor MN1 may be a first NMOS transistor (N-type Metal-Oxide-Semiconductor Field-Effect Transistor). The first P-type transistor MP1 has a control terminal coupled to a first node N1, a first terminal coupled to a second node N2, and a second terminal coupled to a ground voltage VSS. The first current source 271 supplies a first source current to the second node N2. The first N-type transistor MN1 has a control terminal coupled to the second node N2, a first terminal coupled to an output node NOUT of the buffer stage 500, and a second terminal coupled to a supply voltage VDD. The first current sink 261 draws a first sink current from the output node NOUT of the buffer stage 500. A voltage generator 520 of the control circuit 510 includes a second current sink 262, a second P-type transistor MP2, a second current source 272, and a second N-type transistor MN2. The second P-type transistor MP2 may be a second PMOS transistor. The second N-type transistor MN2 may be a second NMOS transistor. The second current sink 262 draws a second sink current from a third node N3. The second P-type transistor MP2 has a control terminal coupled to a fourth node N4, a first terminal coupled to the supply voltage VDD, and a second terminal coupled to the third node N3. The second current source 272 supplies a second source current to a fifth node N5. The second N-type transistor MN2 has a control terminal coupled to a sixth node N6, a first terminal coupled to the ground voltage VSS, and a second terminal coupled to the fifth node N5. A voltage-to-current converter 530 of the control circuit 510 includes a third P-type transistor MP3, a second resistor R2, a third N-type transistor MN3, a third resistor R3, a fourth P-type transistor MP4, and a fifth P-type transistor MP5. The third P-type transistor MP3 may be a third PMOS transistor. The third N-type transistor MN3 may be a third NMOS transistor. The fourth P-type transistor MP4 may be a fourth PMOS transistor. The fifth P-type transistor MP5 may be a fifth PMOS transistor. The third P-type transistor MP3 has a control terminal coupled to the third node N3, a first terminal coupled to the fourth node N4, and a second terminal coupled to a seventh node N7. The second resistor R2 is coupled between the supply voltage VDD and the fourth node N4. The resistance of the second resistor R2 may be substantially equal to the resistance of the first resistor R1. The third N-type transistor MN3 has a control terminal coupled to the fifth node N5, a first terminal coupled to the sixth node N6, and a second terminal coupled to the seventh node N7. The third resistor R3 is coupled between the sixth node N6 and the ground voltage VSS. The resistance of the third resistor R3 may be substantially equal to the resistance of the first resistor R1. The fourth P-type transistor MP4 has a control terminal coupled to the seventh node N7, a first terminal coupled to the supply voltage VDD, and a second terminal coupled to the seventh node N7. The fifth P-type transistor MP5 has a control terminal coupled to the seventh node N7, a first terminal coupled to the supply voltage VDD, and a second terminal coupled to the first node N1. A current mirror is formed by the fourth P-type transistor MP4 and the fifth P-type transistor MP5. The fourth P-type transistor MP4 and the fifth P-type transistor MP5 substantially have the same transistor size. A current-to-voltage converter 540 of the control circuit 510 includes a first resistor R1 coupled between an input node NIN of the buffer stage 500 and the first node N1.

The operation theory of the buffer stage 500 can be understood according to the following equations (26) to (38).

$$V2 - V1 = VSGP1 \quad (26)$$

$$V2 - VOUT = VGSN1 \quad (27)$$

$$VDD - V4 = VSGP2 \quad (28)$$

$$V6 - VSS = VGSN2 \quad (29)$$

$$R3 = R2 = \frac{R1}{A} \quad (30)$$

$$I1 = \frac{VDD - V4}{R2} = \frac{VSGP2}{R2} \quad (31)$$

$$I2 = \frac{V6 - VSS}{R3} = \frac{VGSN2}{R3} \quad (32)$$

$$I3 = I2 - I1 \quad (33)$$

$$I4 = \frac{I3}{A} \quad (34)$$

$$VGSN2 - VSGP2 = I2 \cdot R3 - I1 \cdot R2 = I3 \cdot R2 \quad (35)$$

$$I3 \cdot R2 = (A \cdot I4) \times \left(\frac{R1}{A}\right) = I4 \cdot R1 \quad (36)$$

$$V1 = VIN + I4 \times R1 = VIN + VGSN2 - VSGP2 \quad (37)$$

$$\begin{aligned} VOUT &= V1 + VSGP1 - VGSN1 = \\ &\quad VIN + (VSGP1 - VSGP2) + (VGSN2 - VGSN1) \approx VIN \end{aligned} \quad (38)$$

where "V1" represents the voltage V1 at the first node N1, "V2" represents the voltage V2 at the second node N2, "VSGP1" represents the voltage difference between the first terminal and the control terminal of the first P-type transistor MP1, "VOUT" represents the output voltage VOUT at the output node NOUT of the buffer stage 500, "VGSN1" represents the voltage difference between the control terminal and the first terminal of the first N-type transistor MN1, "VSGP2" represents the voltage difference between the first terminal and the control terminal of the second P-type transistor MP2, "VGSN2" represents the voltage difference between the control terminal and the first terminal of the second N-type transistor MN2, "A" represents a constant value, "VDD" represents the supply voltage VDD, "V4" represents the voltage V4 at the fourth node N4, "V6" represents the voltage V6 at the sixth node N6, "VSS" represents the ground voltage VSS, "R1" represents the resistance of the first resistor R1, "R2" represents the resistance of the second resistor R2, "R3" represents the resistance of the third resistor R3, "I1" represents the current flowing through the second resistor R2, "I2" represents the current flowing through the third resistor R3, "I3" represents the current difference between the current I2 and the current I1, "I4" represents the current flowing through the first resistor R1, and "VIN" represents the input voltage VIN at the input node NIN of the buffer stage 500.

That is, the voltage generator 520 may provide the voltage V4 at the fourth node N4 and the voltage V6 at the sixth node N6. By appropriately designing the transistor size of the second P-type transistor MP2 and the second sink current to the second current sink 262, the voltage difference VSGP2 between the supply voltage VDD and the voltage V4 can be substantially equal to the voltage difference VSGP1 between the first terminal and the control terminal of the first P-type transistor MP1. By appropriately designing the transistor size of the second N-type transistor MN2 and the second source current from the second current source 272, the voltage difference VGSN2 between the voltage V6 and the ground voltage VSS can be substantially equal to the voltage difference VGSN1 between the control terminal and the first terminal of the first N-type transistor MN1. The voltage V4 and the voltage V6 can be considered as the aforementioned compensation voltage VP. The current I1 flowing through the second resistor R2 may be linearly related to the voltage V4. The current I2 flowing through the third resistor R3 may be linearly related to the voltage V6. It may be assumed that the voltage difference VGSN2 is larger than the voltage difference VSGP2. The current I3 may be a current difference formed by subtracting the current I1 from the current I2. The fourth P-type transistor MP4 and the fifth P-type MP5 can form a current mirror, so that the current I4 flowing through the first resistor R1 may be 1/A times the current I3, where "A" may be any constant positive value. The current I4 may can be considered as the aforementioned compensation current IP. According to Ohm's Law, if the resistance of the first resistor R1 is A times the resistance of each of the second resistor R2 and the third resistor R3, the voltage V1 at the first node N1 may be higher than the input voltage VIN at the input node NIN by the voltage difference VGSN2 minus the voltage difference VSGP2. The voltage V1 can be considered as the aforementioned recovery compensation voltage VPR. With such a design, the output voltage VOUT at the output node NOUT may be lower than the voltage V1 by the voltage difference VGSN1 minus the voltage difference VSGP1. If the voltage difference VGSN2 is substantially equal to the voltage difference VGSN1 and the voltage difference VSGP2 is substantially equal to the voltage difference VSGP1, the output voltage VOUT can be substantially equal to the input voltage VIN.

Figure 6:
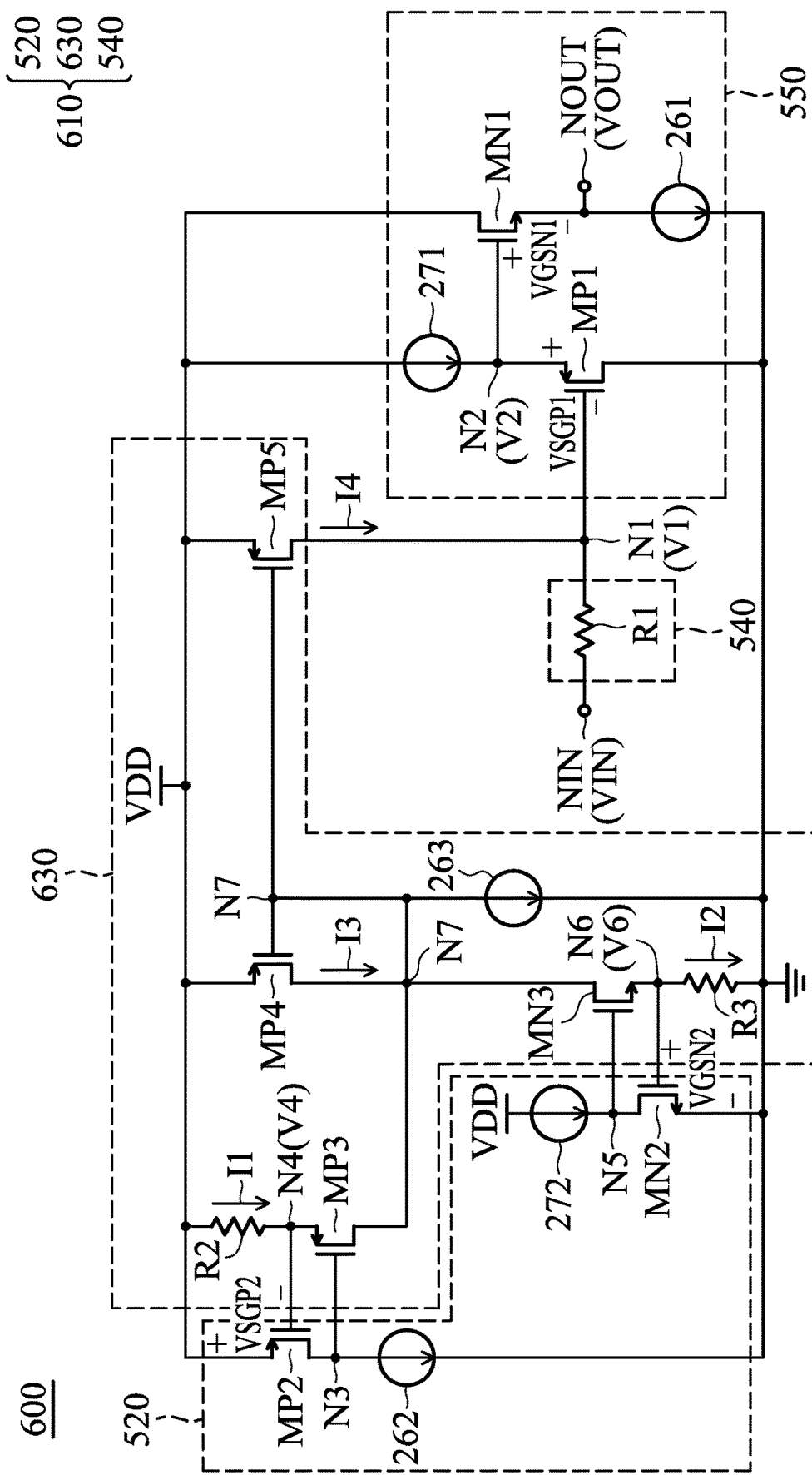
FIG. 6 is a diagram of a buffer stage according to an embodiment of the invention.

FIG. 6 is a diagram of a buffer stage 600 according to an embodiment of the invention. FIG. 6 is similar to FIG. 5. The difference between the two embodiments is that a voltage-to-current converter 630 of a control circuit 610 of the buffer stage 600 further includes a third current sink 263. The third current sink 263 draws a third sink current from the seventh node N7. In the embodiment of FIG. 5, it is assumed that the voltage difference VGSN2 should be larger than the voltage difference VSGP2. However, if the voltage difference VGSN2 is smaller than the voltage difference VSGP2, the current I2 may be smaller than the current I1, and the current I3 from the current mirror may be a negative value. To solve the problem, a third current sink 263 is added and coupled to the seventh node N7 in the embodiment of FIG. 6. When the voltage difference VGSN2 is smaller than the voltage difference VSGP2, the third current sink 263 can provide an additional discharge path for the seventh node N7. Such a design can keep the current mirror operating normally, and prevent the buffer stage 600 from being damaged by unbalanced current distribution. Other features of the buffer stage 600 of FIG. 6 are similar to those of the buffer stage 500 of FIG. 5. Accordingly, the two embodiments can achieve similar levels of performance.

Figure 7:
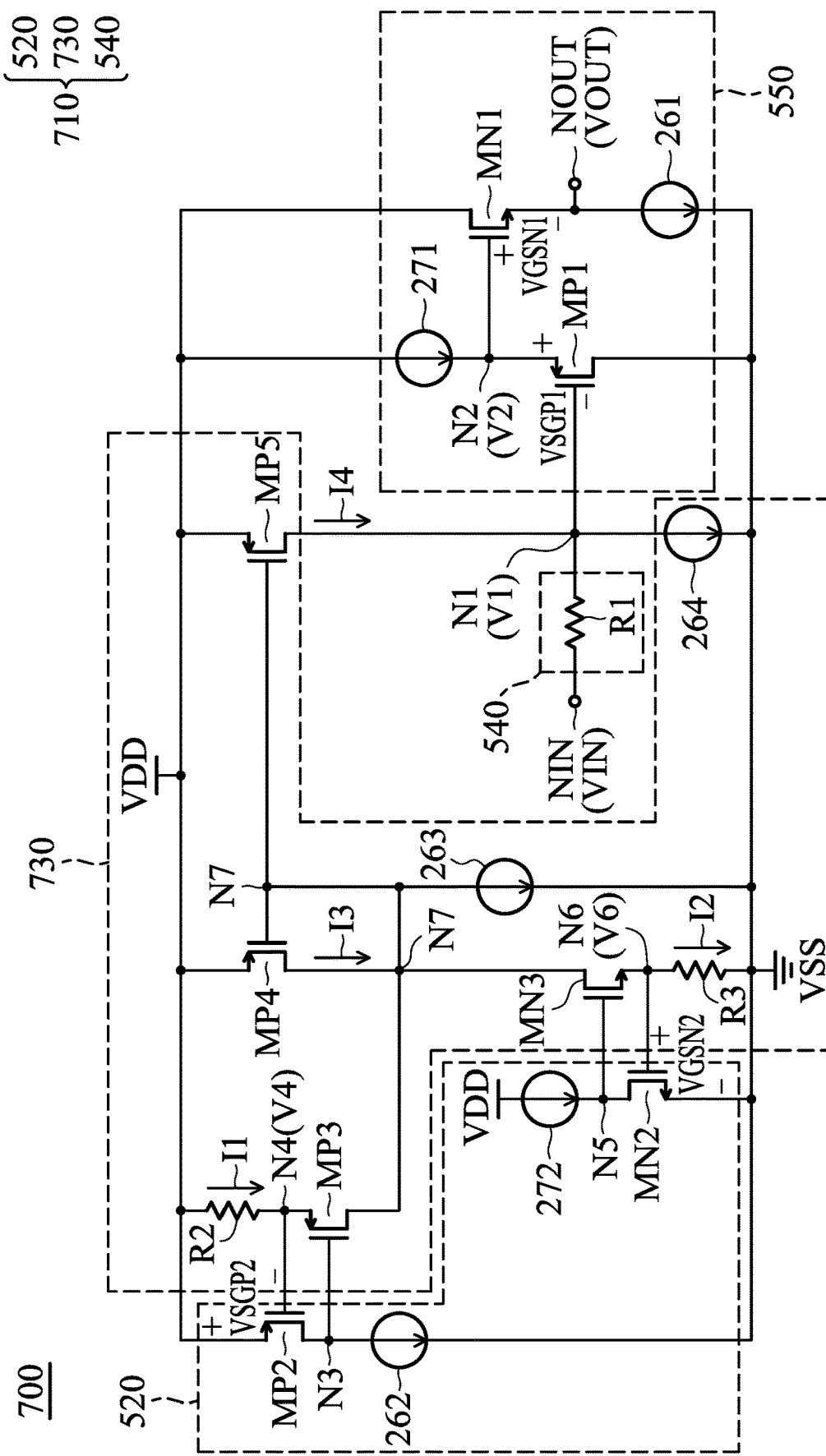
FIG. 7 is a diagram of a buffer stage according to an embodiment of the invention.

FIG. 7 is a diagram of a buffer stage 700 according to an embodiment of the invention. FIG. 7 is similar to FIG. 6. The difference between the two embodiments is that a voltage-to-current converter 730 of a control circuit 710 of the buffer stage 700 further includes a fourth current sink 264. The fourth current sink 264 draws a fourth sink current from the first node N1. The fourth sink current to the fourth current sink 264 may be substantially equal to the third sink current to the third current sink 263. The fourth current sink 264 can eliminate the current mismatch due to the existence of third current sink 263, and further improve the output accuracy of the buffer stage 700. Other features of the buffer stage 700 of FIG. 7 are similar to those of the buffer stage 600 of FIG. 6. Accordingly, the two embodiments can achieve similar levels of performance.

The invention proposes a buffer stage with a novel control circuit. The proposed control circuit can compensate for the non-ideal output characteristics of a corresponding source follower. Therefore, the output voltage of the source follower can be almost the same as the input voltage of the source follower. Since there is no AC (Alternating Current) coupling capacitor disposed at the input node of the buffer stage, both AC and DC (Direct Current) input components can be completely transmitted from the input node to the output node of the buffer stage. To be brief, the proposed control circuit of the buffer stage can make the output voltage perfectly follow the input voltage without distortion.

Note that the above voltages, currents, resistances, inductances, capacitances and other element parameters are not limitations of the invention. A designer can adjust these parameters according to different requirements. The buffer stage and control circuit of the invention are not limited to the configurations of FIGS. 1-7. The invention may merely include any one or more features of any one or more embodiments of FIGS. 1-7. In other words, not all of the features displayed in the figures should be implemented in the buffer stage and control circuit of the invention. Although the embodiments of the invention use MOSFETs as examples, the invention is not limited thereto, and those skilled in the art may use other types of transistors such as BJT (Bipolar Junction Transistors), JFET (Junction Gate Field Effect Transistor), FinFET (Fin Field Effect Transistor), etc.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A buffer stage, comprising:
  a control circuit, comprising:
    a voltage generator, configured to generate a compensation voltage;
    a voltage-to-current converter, configured to convert the compensation voltage into a compensation current; and
    a current-to-voltage converter, configured to convert the compensation current into a recovery compensation voltage;
  wherein the recovery compensation voltage is a sum of an input voltage of the buffer stage and a voltage produced by the current-to-voltage converter such that the recovery compensation voltage modifies an output voltage of the buffer stage; and
  wherein the current-to-voltage converter comprises a first resistor including a first terminal and a second terminal, the first terminal being directly coupled to an input node of the buffer stage and the second terminal being directly coupled to a gate of a source follower.

2. The buffer stage as claimed in claim 1, wherein the source follower is coupled to the control circuit and configured to generate the output voltage of the buffer stage.

3. The buffer stage as claimed in claim 1, wherein the source follower comprises:
   a first N-type transistor, wherein the first N-type transistor has a control terminal coupled to a first node, a first terminal coupled to an output node of the buffer stage, and a second terminal coupled to a supply voltage; and
   a first current sink, drawing a first sink current from the output node of the buffer stage;
   wherein the first resistor is coupled between the input node of the buffer stage and the first node.

4. The buffer stage as claimed in claim 3, wherein the voltage generator comprises:
   a first current source, supplying a first source current to a second node; and
   a second N-type transistor, wherein the second N-type transistor has a control terminal coupled to the second node, a first terminal coupled to a ground voltage, and a second terminal coupled to the second node.

5. The buffer stage as claimed in claim 4, wherein the voltage-to-current converter comprises:
   an operational amplifier, wherein the operational amplifier has a positive input terminal coupled to a third node, a negative input terminal coupled to the second node, and an output terminal coupled to a fourth node;
   a first P-type transistor, wherein the first P-type transistor has a control terminal coupled to the fourth node, a first terminal coupled to the supply voltage, and a second terminal coupled to the third node;
   a second resistor, coupled between the third node and the ground voltage; and
   a second P-type transistor, wherein the second P-type transistor has a control terminal coupled to the fourth node, a first terminal coupled to the supply voltage, and a second terminal coupled to the first node.

6. The buffer stage as claimed in claim 5, wherein a resistance of the second resistor is substantially equal to a resistance of the first resistor.

7. The buffer stage as claimed in claim 5, wherein the voltage-to-current converter further comprises:
   a capacitor, coupled between the fourth node and the third node.

8. The buffer stage as claimed in claim 3, wherein the voltage generator comprises:
   a first current source, supplying a first source current to a second node; and
   a second N-type transistor, wherein the second N-type transistor has a control terminal coupled to a third node, a first terminal coupled to a ground voltage, and a second terminal coupled to the second node.

9. The buffer stage as claimed in claim 8, wherein the voltage-to-current converter comprises:
   a third N-type transistor, wherein the third N-type transistor has a control terminal coupled to the second node, a first terminal coupled to the third node, and a second terminal coupled to a fourth node;
   a second resistor, coupled between the third node and the ground voltage;
   a first P-type transistor, wherein the first P-type transistor has a control terminal coupled to the fourth node, a first terminal coupled to the supply voltage, and a second terminal coupled to the fourth node; and
   a second P-type transistor, wherein the second P-type transistor has a control terminal coupled to the fourth node, a first terminal coupled to the supply voltage, and a second terminal couple to the first node.

10. The buffer stage as claimed in claim 9, wherein a resistance of the second resistor is substantially equal to a resistance of the first resistor.

11. The buffer stage as claimed in claim 1, wherein the source follower comprises:
    a first P-type transistor, wherein the first P-type transistor has a control terminal coupled to a first node, a first terminal coupled to an output node of the buffer stage, and a second terminal coupled to a ground voltage; and
    a first current source, supplying a first source current to the output node of the buffer stage;
    wherein the first resistor is coupled between the input node of the buffer stage and the first node.

12. The buffer stage as claimed in claim 11, wherein the voltage generator comprises:
    a first current sink, drawing a first sink current from a second node; and
    a second P-type transistor, wherein the second P-type transistor has a control terminal coupled to a third node, a first terminal coupled to a supply voltage, and a second terminal coupled to the second node.

13. The buffer stage as claimed in claim 12, wherein the voltage-to-current converter comprises:
    a third P-type transistor, wherein the third P-type transistor has a control terminal coupled to the second node, a first terminal coupled to the third node, and a second terminal coupled to a fourth node;
    a second resistor, coupled between the supply voltage and the third node;
    a first N-type transistor, wherein the first N-type transistor has a control terminal coupled to the fourth node, a first terminal coupled to the ground voltage, and a second terminal coupled to the fourth node; and
    a second N-type transistor, wherein the second N-type transistor has a control terminal coupled to the fourth node, a first terminal coupled to the ground voltage, and a second terminal coupled to the first node.

14. The buffer stage as claimed in claim 13, wherein a resistance of the second resistor is substantially equal to a resistance of the first resistor.

15. The buffer stage as claimed in claim 1, wherein the source follower comprises:
    a first P-type transistor, wherein the first P-type transistor has a control terminal coupled to a first node, a first terminal coupled to a second node, and a second terminal coupled to a ground voltage;
    a first current source, supplying a first source current to the second node;
    a first N-type transistor, wherein the first N-type transistor has a control terminal coupled to the second node, a first terminal coupled to an output node of the buffer stage, and a second terminal coupled to a supply voltage; and
    a first current sink, drawing a first sink current from the output node of the buffer stage;
    wherein the first resistor is coupled between the input node of the buffer stage and the first node.

16. The buffer stage as claimed in claim 15, wherein the voltage generator comprises:
    a second current sink, drawing a second sink current from a third node;
    a second P-type transistor, wherein the second P-type transistor has a control terminal coupled to a fourth node, a first terminal coupled to the supply voltage, and a second terminal coupled to the third node;

a second current source, supplying a second source current to a fifth node; and a second N-type transistor, wherein the second N-type transistor has a control terminal coupled to a sixth node, a first terminal coupled to the ground voltage, and a second terminal coupled to the fifth node.

17. The buffer stage as claimed in claim 16, wherein the voltage-to-current converter comprises:

a third P-type transistor, wherein the third P-type transistor has a control terminal coupled to the third node, a first terminal coupled to the fourth node, and a second terminal coupled to a seventh node;

a second resistor, coupled between the supply voltage and the fourth node;

a third N-type transistor, wherein the third N-type transistor has a control terminal coupled to the fifth node, a first terminal coupled to the sixth node, and a second terminal coupled to the seventh node;

a third resistor, coupled between the sixth node and the ground voltage;

a fourth P-type transistor, wherein the fourth P-type transistor has control terminal coupled to the seventh node, a first terminal coupled to the supply voltage, and a second terminal coupled to the seventh node; and a fifth P-type transistor, wherein the fifth P-type transistor has a control terminal coupled to the seventh node, a first terminal coupled to the supply voltage, and a second terminal coupled to the first node.

18. The buffer stage as claimed in claim 17, wherein a resistance of each of the second resistor and the third resistor is substantially equal to a resistance of the first resistor.

19. The buffer stage as claimed in claim 17, wherein the voltage-to-current converter further comprises:

a third current sink, drawing a third sink current from the seventh node.

20. The buffer stage as claimed in claim 19, wherein the voltage-to-current converter further comprises:

a fourth current sink, drawing a fourth sink current from the first node.

21. The buffer stage as claimed in claim 20, wherein the fourth sink current is substantially equal to the third sink current.

22. A control circuit for controlling a source follower, comprising:

a voltage generator, configured to generate a compensation voltage;

a voltage-to-current converter, configured to convert the compensation voltage into a compensation current; and a current-to-voltage converter, configured to convert the compensation current into a recovery compensation voltage;

wherein the recovery compensation voltage is a sum of an input voltage of a buffer stage and a voltage produced by the current-to-voltage converter such that the recovery compensation voltage modifies an output voltage of the buffer stage; and wherein the current-to-voltage converter comprises a first resistor including a first terminal and a second terminal, the first terminal being directly coupled to an input voltage node and the second terminal being directly coupled to a gate of the source follower.

* * * * *